United States Patent
Lovett

(10) Patent No.: US 11,521,670 B2
(45) Date of Patent: Dec. 6, 2022

(54) WORD LINES COUPLED TO PULL-DOWN TRANSISTORS, AND RELATED DEVICES, SYSTEMS, AND METHODS

(71) Applicant: Micron Technology, Inc., Boise, ID (US)

(72) Inventor: Simon J. Lovett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/096,476

(22) Filed: Nov. 12, 2020

(65) Prior Publication Data

US 2022/0148642 A1    May 12, 2022

(51) Int. Cl.
  *G11C 8/08* (2006.01)
  *G11C 11/408* (2006.01)
  *G11C 7/02* (2006.01)
  *G11C 8/14* (2006.01)

(52) U.S. Cl.
  CPC ............ *G11C 11/4085* (2013.01); *G11C 7/02* (2013.01); *G11C 8/08* (2013.01); *G11C 11/4087* (2013.01); *G11C 8/14* (2013.01)

(58) Field of Classification Search
  CPC .... G11C 8/08; G11C 11/4087; G11C 11/4085
  See application file for complete search history.

(56) References Cited

U.S. PATENT DOCUMENTS

| | | | | |
|---|---|---|---|---|
| 4,455,629 A * | 6/1984 | Suzuki | ................ | H03M 7/005 365/189.11 |
| 5,986,946 A * | 11/1999 | Shirley | ................ | G11C 8/14 365/189.11 |
| 6,307,793 B1 * | 10/2001 | Murakami | ............ | G11C 5/063 365/189.11 |
| 7,636,268 B1 * | 12/2009 | Peng | ................ | H03K 19/1776 365/206 |
| 8,054,696 B1 * | 11/2011 | Park | ................ | G11C 29/832 365/189.11 |
| 8,565,036 B2 * | 10/2013 | Kitayama | ......... | H01L 27/10897 365/204 |
| 2004/0042321 A1 * | 3/2004 | Kirsch | ................ | G11C 8/08 365/230.06 |
| 2007/0165479 A1 * | 7/2007 | Rehm | ................ | G11C 8/08 365/230.06 |
| 2008/0253172 A1 * | 10/2008 | Yamagami | .......... | G11C 29/028 365/230.06 |
| 2014/0119101 A1 * | 5/2014 | Wang | ................ | G11C 16/04 365/154 |
| 2017/0076785 A1 * | 3/2017 | Ishii | ................ | G11C 11/418 |

* cited by examiner

Primary Examiner — Mushfique Siddique
(74) Attorney, Agent, or Firm — TraskBritt

(57) ABSTRACT

Memory devices including word lines coupled to pull-down transistors are disclosed. A memory device may include a number of memory cells, a first word line, and a second word line. The first word line may be configured to apply a voltage to a number of transistors to access at least one of the number of memory cells. The first word line may include a first portion electrically coupled to a first driver and a second portion electrically coupled to a gate of a pull-down transistor. The second word line may be positioned adjacent to the first word line. The second word line may include a third portion electrically coupled to a second driver and a fourth portion electrically coupled to a terminal of the pull-down transistor. Associated systems are also disclosed.

12 Claims, 6 Drawing Sheets

US 11,521,670 B2

WORD LINES COUPLED TO PULL-DOWN TRANSISTORS, AND RELATED DEVICES, SYSTEMS, AND METHODS

TECHNICAL FIELD

Embodiments of the disclosure relate to memory devices. More specifically, various embodiments relate to memory devices including word lines coupled to pull-down transistors, and to related methods, devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

Memory devices may include many memory cells configured to be accessible by word lines and bit lines. The word lines may extend in parallel relative to the memory cells.

Some memory devices include a number of memory cells, each configured to store a bit of information, e.g., as a charge on a capacitor. The memory devices further include access transistors, word lines, and bit lines configured to provide for access to the number of memory cells. Access to the memory cells may provide the ability to discharge and charge the memory cells individually to read and write data to the memory cells collectively. The word lines and bit lines may be arranged in rows and columns around, above, and/or below the memory cells. The word lines may be long conductive lines, arranged in parallel, closely spaced, and configured to be charged individually.

Word lines may be affected by capacitive coupling. For example, when a particular word line is charged with an access voltage (e.g., to activate an access transistor), word lines adjacent to the particular word line may receive voltage through capacitive coupling. Charging (even partial charging) of word lines that are not intended to be accessed may result in discharging (or partial discharging) of memory cells which may impair performance of the memory device.

BRIEF DESCRIPTION OF THE SEVERAL VIEWS OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Some embodiments of the present disclosure include one or more pull-down transistors electrically coupled to word lines to decrease the effects of capacitive coupling between word lines. Some embodiments of the present disclosure include one or more pull-down transistors electrically coupled between pairs of word lines such that charging a particular word line may activate at least one of the pull-down transistors to pull down the voltage of word lines close to the particular word line. Pulling down the voltage of nearby word lines may decrease the effects of capacitive coupling between the charged word line and one or more nearby word lines.

Figure 1:
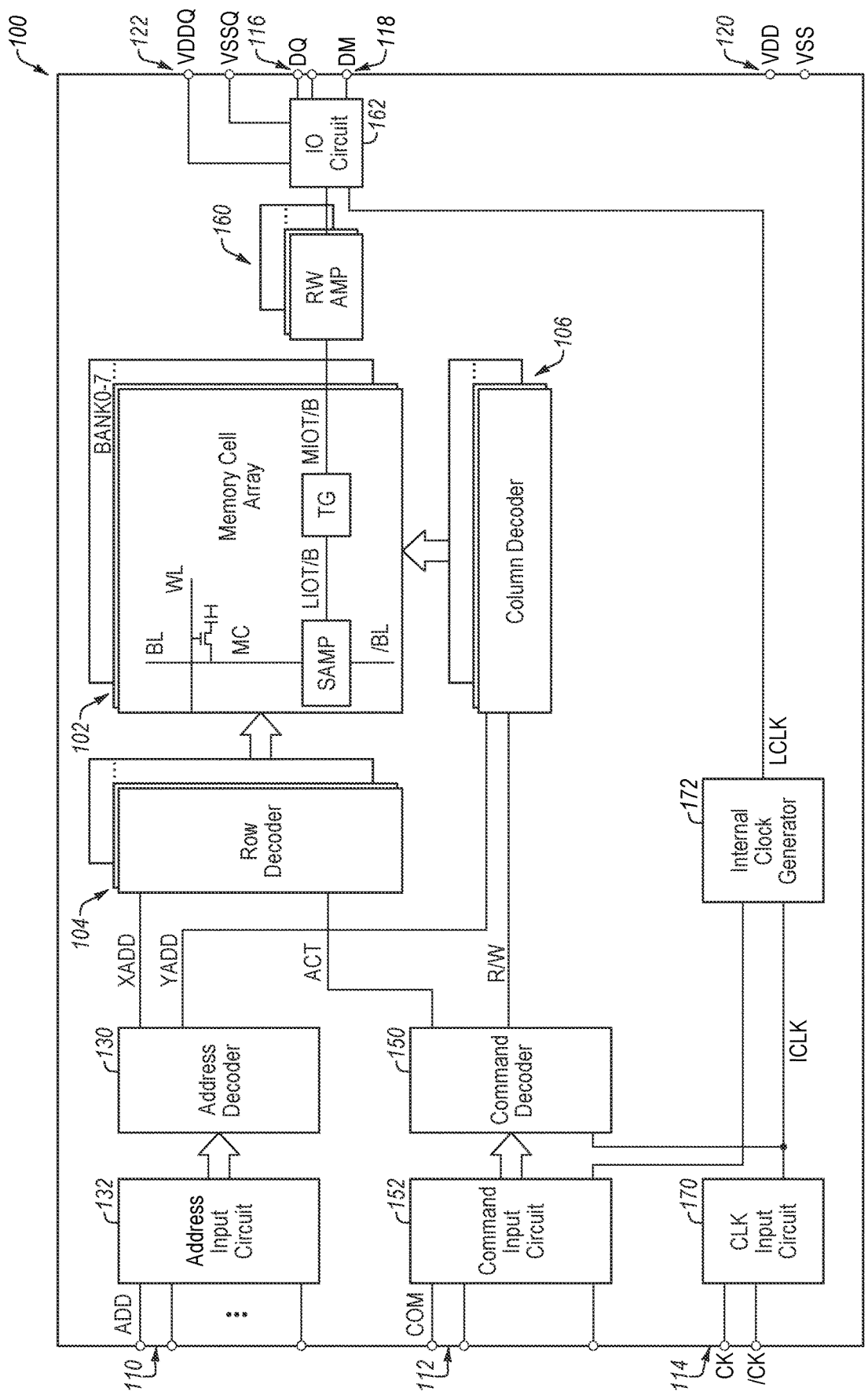
FIG. 1 is a block diagram illustrating an example memory device, in accordance with at least one embodiment of the present disclosure.

FIG. 1 is a functional block diagram illustrating an example memory device 100, in accordance with at least one embodiment of the present disclosure. Memory device 100 may include, for example, a DRAM (dynamic random access memory), a SRAM (static random access memory), a SDRAM (synchronous dynamic random access memory), a DDR SDRAM (double data rate SDRAM, such as a DDR4 SDRAM and the like), a SGRAM (synchronous graphics random access memory) or a three-dimensional (3D) DRAM. Memory device 100, which may be integrated on a semiconductor chip, may include memory array 102.

In the embodiment of FIG. 1, memory array 102 is shown as including eight memory banks BANK0-7. More or fewer banks may be included in memory array 102 of other embodiments. Each memory bank includes a number of access lines (word lines WL), a number of data lines (bit lines BL and/BL), and a number of memory cells MC arranged at intersections of the number of word lines WL and the number of bit lines BL and/BL. The selection of a word line WL may be performed by a row decoder 104 and the selection of the bit lines BL and/BL may be performed by a column decoder 106. In the embodiment of FIG. 1, row decoder 104 may include a respective row decoder for each memory bank BANK0-7, and column decoder 106 may include a respective column decoder for each memory bank BANK0-7. Additionally, although not illustrated in FIG. 1, memory array 102 may include any number of layers, e.g., arranged in a stack, e.g., a 3D stack.

Bit lines BL and/BL are coupled to a respective sense amplifier SAMP. Read data from bit line BL or/BL may be amplified by sense amplifier SAMP, and transferred to read/write amplifiers 160 over complementary local data lines (LIOT/B), a transfer gate (TG), and complementary main data lines (MIOT/B). Conversely, write data outputted from read/write amplifiers 160 may be transferred to sense amplifier SAMP over the complementary main data lines MIOT/B, transfer gate TG, and complementary local data lines LIOT/B, and written in the memory cell MC coupled to bit line BL or/BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as a power supply terminal 120 and a power supply terminal 122.

During a contemplated operation, one or more command signals COM, received via command terminals 112, may be conveyed to a command decoder 150 via a command input circuit 152. Command decoder 150 may include a circuit configured to generate various internal commands via decoding the one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and bit line BL specified by the column address YADD may be selected.

In response to active command ACT, a read signal, a row address XADD, and a column address YADD, data may be read from the memory cell MC specified by row address XADD and column address YADD. The read data may be output via sense amplifier SAMP, transfer gate TG, read/write amplifiers 160, input/output circuit 162, and data terminals 116. Further, in response active command ACT, a write signal, a row address XADD, and a column address YADD, write data may be supplied to memory array 102 via data terminals 116, input/output circuit 162, read/write amplifiers 160, transfer gate TG, and sense amplifier SAMP. The write data may be written to the memory cell MC specified by row address XADD and column address YADD.

Clock signals CK and/CK may be received via clock terminals 114. A CLK Input circuit 170 may generate internal clock signals ICLK based on the clock signals CK and /CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When the data mask signal DM is activated, overwrite of corresponding data may be prohibited.

Figure 2:
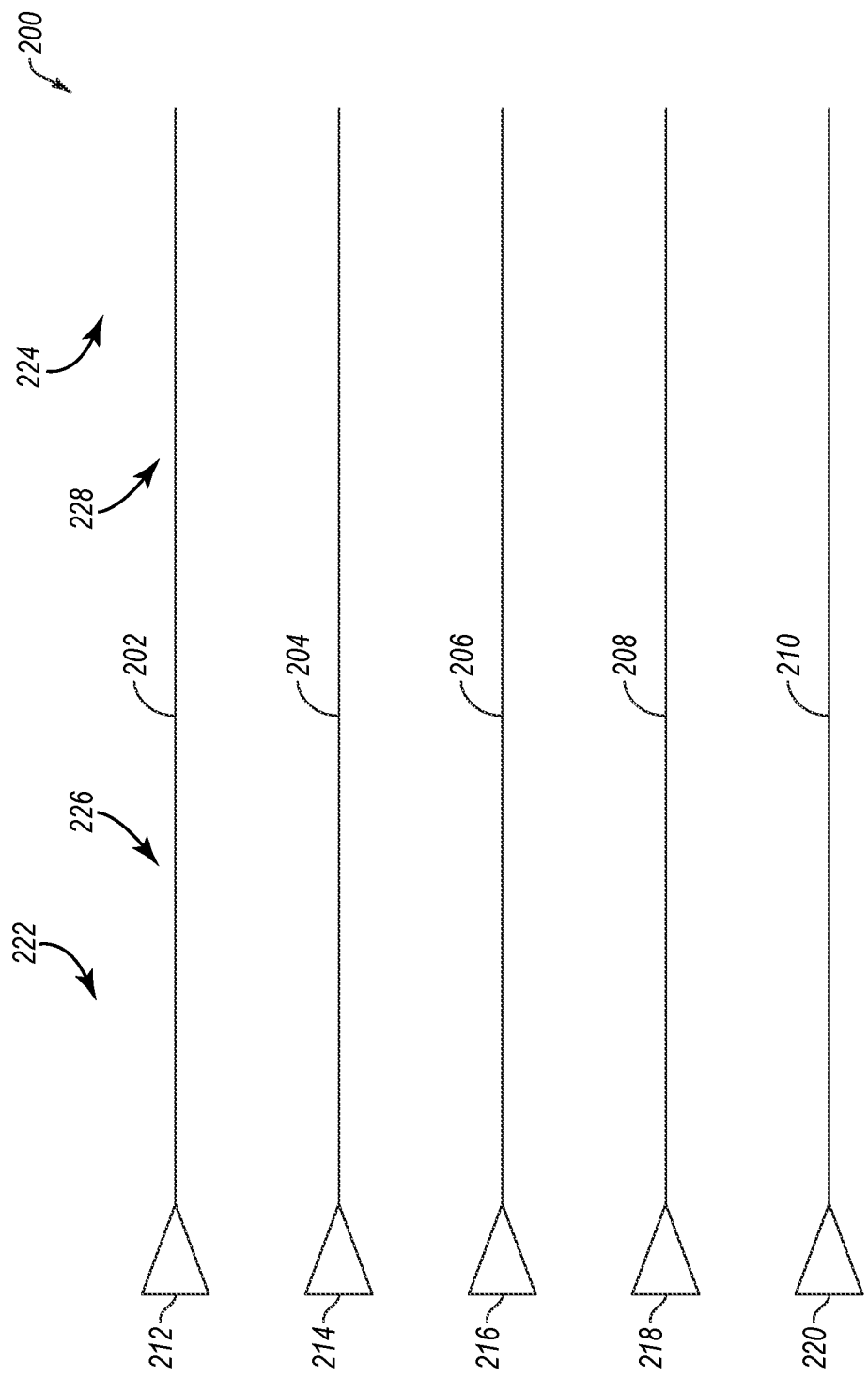
FIG. 2 is a schematic diagram illustrating word lines and drivers of a memory device.

FIG. 2 is a schematic diagram illustrating word lines and drivers of a memory device 200. In particular, FIG. 2 illustrates a word line 202, a word line 204, a word line 206, a word line 208, a word line 210, a driver 212, a driver 214, a driver 216, a driver 218, and a driver 220. Word line 202 is electrically coupled to driver 212, word line 204 electrically is coupled to driver 214, word line 206 is electrically coupled to driver 216, word line 208 is electrically coupled to driver 218, and word line 210 is electrically coupled to driver 220. All of word line 202, word line 204, word line 206, word line 208, and word line 210 are arranged in parallel and each extend from a respective driver at a near side 222 (or portion) of memory device 200 to a far side 224 (or portion) of memory device 200. The configuration of drivers and word lines illustrated in FIG. 2 may be common in 3D memory devices, e.g., 3D DRAM memory devices.

The configuration of word lines illustrated in FIG. 2 may exhibit capacitive coupling between the word lines. For example, if word line 204 is charged by driver 214 to an access voltage (e.g., 3 Volts), word line 202 and/or word line 206 may capacitively couple with word line 204 and may be charged to a voltage (e.g., 0.75 volts). The degree of capacitive coupling may depend on the dimension of word lines, the separation between the word lines, and/or a material composition of the word lines.

The degree to which portions of the word lines are affected by the capacitive coupling may depend at least in part on a distance between the affected portion of the word lines and their respective drivers. In particular, portions (second portions 228) of word lines that are farther from their drivers (i.e., in comparison to portions (first portions 226) of word lines that are closer to their drivers) may be more affected by capacitive coupling and may exhibit higher resulting voltage. This may be because the drivers may be configured to hold the voltage of their word lines. As a specific example, if word line 204 is charged by its driver 214 to 3 Volts, driver 212 may be configured to hold word line 202 to a voltage of −0.25 volts. However, due to resistance and capacitance of word line 202, at least for a time, through capacitive coupling, a portion (e.g., second portion 228 (in particular a far side) of word line 202 may be charged, e.g., to 0.75 volts.

A memory device may be configured to charge its word lines to an access voltage to activate transistors which allow the transfer of charge from a memory cell (e.g., including a capacitor) to a digit line. A partial charge on a word line may allow a memory cell to partially discharge. Memory cells that are allowed to discharge, even partially, when they are not meant to be accessed, may result in memory cells not properly storing their values.

One way to address the effects of memory cell discharge due to capacitive coupling is to increase a refresh rate of memory cells. Increasing a refresh rate of memory cells may result in increased power consumption of the memory device and/or lower latency of the memory device. Another possible solution is to rearrange the drivers such that adjacent pairs of memory lines are electrically coupled to drivers that are on opposite sides. For example, if this solution were illustrated in FIG. 2, it may be illustrated with driver 214 and driver 218 on the right side of word line 204 and word line 208 respectively (e.g., at second portion 228 and at far side 224) instead of on the left side (e.g., at first portion 226 and at near side 222) as illustrated. There may be disadvantages or other reasons not to position drivers on both sides 222 and 224 of the memory device. For example, it may be difficult (or not cost effective) to place drivers on both sides 222 and 224 of a memory device, e.g., some configurations of a 3D memory device. Placing drivers all on one edge of the array (e.g., near side 222) may have cost or other advantages, e.g., for some configurations of 3D memory structures.

Embodiments of the present disclosure may provide for an improvement over other memory devices by mitigating the effects of capacitive coupling between word lines. Thus, embodiments of the present disclosure may exhibit improved reliability (e.g., by not allowing memory cells to discharge), reduced need for error correction (smaller die size, lower latency), decreased power consumption, longer refresh and/or memory management interval (reduces power and increases bandwidth), greater cell endurance (number of write/read cycles before wearout). Further, embodiments of the present disclosure may provide for decreased capacitive coupling between word lines without rearranging drivers, e.g., embodiments of the present disclosure may provide for decreased capacitive coupling while allowing all of the drivers to be arranged on the same side (e.g., at first portion 226 or at near side 222) of all of the word lines. Embodiments of the present disclosure may find particular applicability in 3D memory devices (e.g., 3D DRAMs or other emerging memories), however, the present disclosure is not limited to 3D memory devices.

Figure 3:
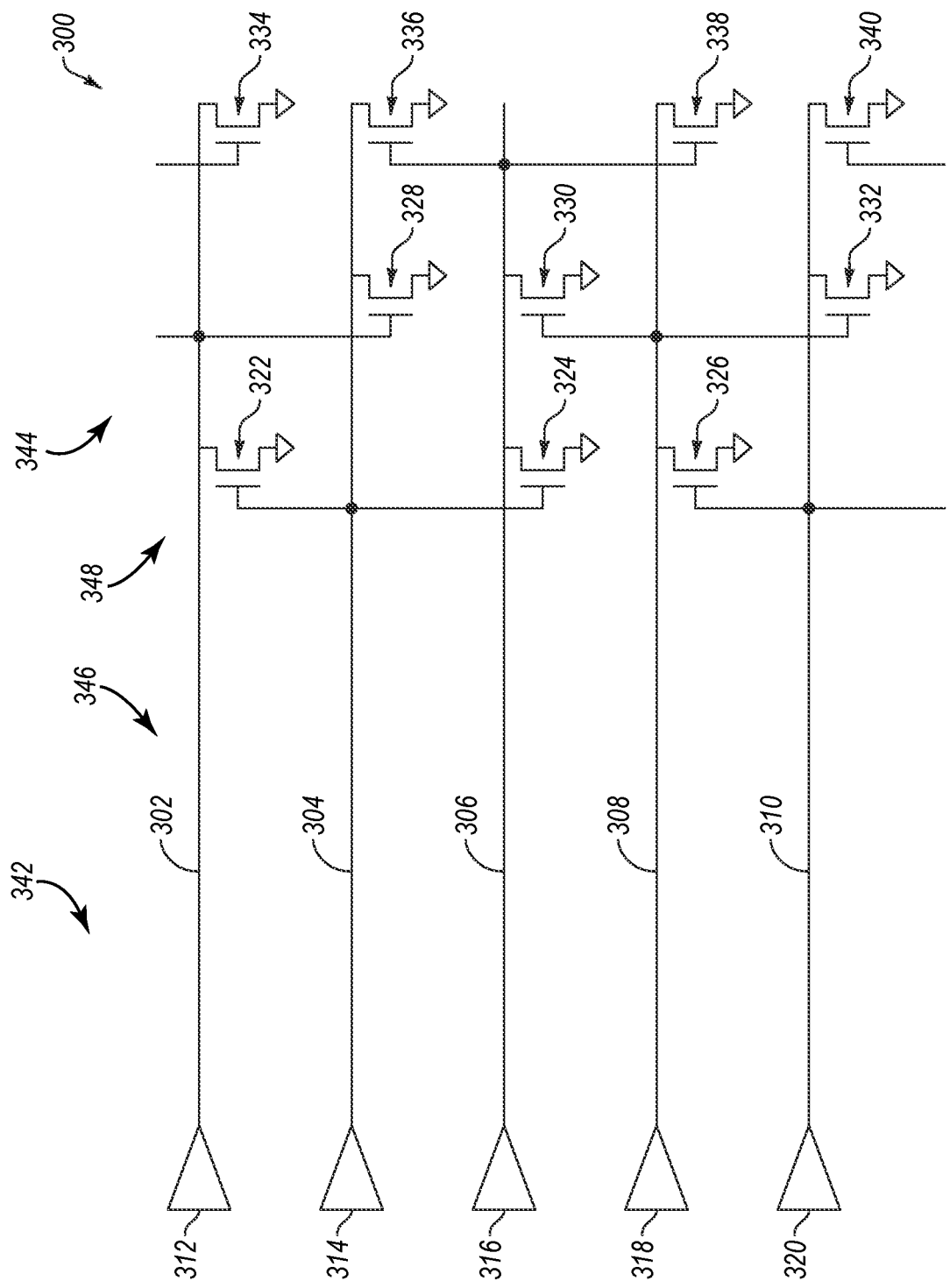
FIG. 3 is a schematic diagram illustrating an example configuration of word lines and pull-down transistors of a memory device in accordance with at least one embodiment of the present disclosure.

FIG. 3 is a schematic diagram illustrating an example configuration of word lines and pull-down transistors of a memory device 300 in accordance with at least one embodiment of the present disclosure. In particular, FIG. 3 illustrates a word line 302, a word line 304, a word line 306, a word line 308, a word line 310, a driver 312, a driver 314, a driver 316, a driver 318, and a driver 320. Word line 302 is electrically coupled to driver 312, word line 304 is electrically coupled to driver 314, word line 306 is electrically coupled to driver 316, word line 308 is electrically coupled to driver 318, and word line 310 is electrically coupled to driver 320. In the present disclosure, word line 302, word line 304, word line 306, word line 308, and word line 310 may be referred to collectively as word lines 302-310 and driver 312, driver 314, driver 316, driver 318, and driver 320 may be referred to collectively as drivers 312-320. Each of word lines 302-310 are electrically coupled to its respective driver (one of drivers 312-320) on the same side (e.g., a near side 342 of device 300 or near portion 346 of word lines 302-310). Each of drivers 312-320 may be configured to set and/or hold the voltage of its respective word line (one of word lines 302-310).

Additionally, FIG. 3 illustrates a pull-down transistor 322, a pull-down transistor 324, a pull-down transistor 326, a pull-down transistor 328, a pull-down transistor 330, a pull-down transistor 332, a pull-down transistor 334, a pull-down transistor 336, a pull-down transistor 338, and a pull-down transistor 340. In the present disclosure, the pull-down transistors shown in FIG. 3 may be collectively referred to as pull-down transistors 322-340. Each of pull-down transistors 322-340 may be variously electrically coupled to two of word lines 302-310 at a far side 344 of device 300 or at a far portion 348 of word lines 302-310. For example, a first terminal (e.g., a gate) of pull-down transistor 322 may be electrically coupled to word line 304 and a second terminal (e.g., a drain) of pull-down transistor 322 may be electrically coupled to word line 302. Similarly, a first terminal (e.g., a gate) of pull-down transistor 324 may be electrically coupled to word line 304 and a second terminal (e.g., a drain) of pull-down transistor 324 may be electrically coupled to word line 306. Additionally, a third terminal (e.g., a source) of each of the pull-down transistors 322-340 may be electrically coupled to another voltage line, e.g., a reference voltage line. In the present disclosure, the term "terminal" may refer to any one of a gate, a source, or a drain of a metal-oxide semiconductor (MOS) transistor.

In the configuration illustrated in FIG. 3, each of word lines 302-310 is electrically coupled to a gate of two of pull-down transistors. In particular, each of word lines 302-310 is electrically coupled to gates of pull-down transistors that are electrically coupled (through drains of the pull-down transistors) to its adjacent word lines. For example, word line 304 is electrically coupled to a gate of pull-down transistor 322 which has a drain electrically coupled to word line 302, and word line 304 is electrically coupled to a gate of pull-down transistor 324 which has a drain electrically coupled to word line 306. Additionally, although not illustrated in FIG. 3, word line 302 is electrically coupled to a gate of a pull-down transistor which has a drain electrically coupled to a word line adjacent to (e.g., "above" (from the perspective of FIG. 3)) word line 302.

Thus, when any of word lines 302-310 is charged (e.g., to an access voltage to access memory cells associated therewith) the voltage on the charged word line reaches the gates of the pull-down transistors that are electrically coupled to word lines adjacent to the charged word line. For example, if word line 304 is charged to an access voltage, the gates of pull-down transistor 322 and pull-down transistor 324 may also receive the access voltage.

Each of pull-down transistors 322-340 may be configured to (when activated) pull down a voltage of a word line to which its drain is electrically coupled to a particular voltage (e.g., a default voltage of a word line that is not being accessed, e.g., −0.25 volts). Thus, when a memory device charges a particular word line (e.g., to access particular memory cells associated with the particular word line), the voltage charging the particular word line may also activate pull-down transistors that are electrically coupled to word lines adjacent to the particular word line. Pulling down the voltage may decrease the effect of capacitive coupling between word lines including at far portion 348 of word lines 302-310. For example, if word line 304 is charged (e.g., to access memory cells associated with word line 304), pull-down transistor 322 and pull-down transistor 324 may be activated, which may pull the voltage of word line 302 and word line 306 down and decrease the effect of capacitive coupling between word line 304 and word line 302 and/or between word line 304 and word line 306.

From another perspective, in the configuration illustrated in FIG. 3, each of word lines 302-310 is electrically coupled to a drain of two of pull-down transistors 322-340. In particular, each of word lines 302-310 is electrically coupled to drains of pull-down transistors that are electrically coupled (through gates) to its adjacent word lines. For example, word line 304 is electrically coupled to a drain of pull-down transistor 328 which has a gate electrically coupled to word line 302, and word line 304 is electrically coupled to a drain of pull-down transistor 336 which has a gate electrically coupled to word line 306. Thus, any of the word lines 302-310 may have its voltage pulled down when a word line adjacent thereto is charged. For example, word line 304 may have its voltage pulled down when either of word line 302 or word line 306 is charged.

Figure 4:
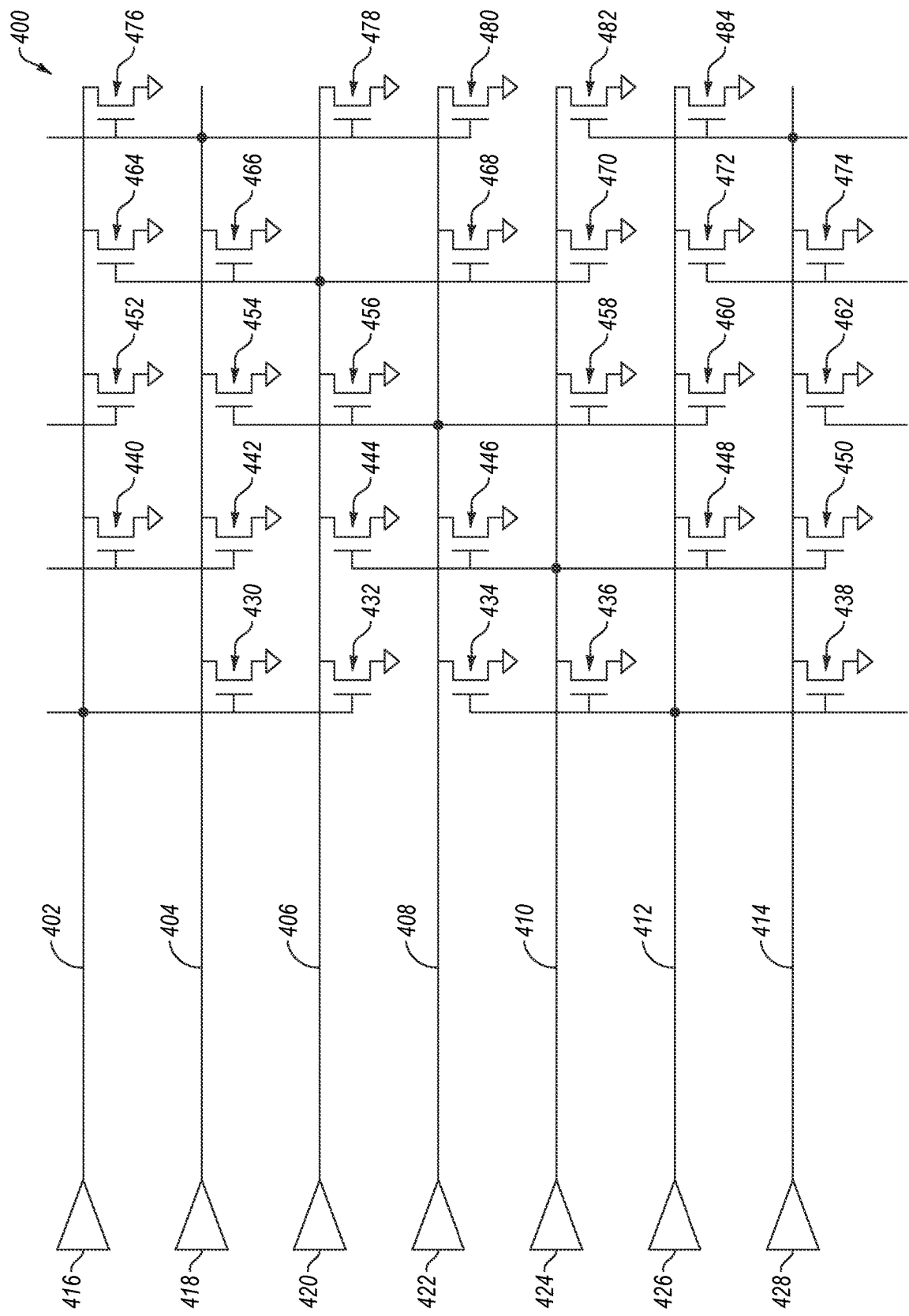
FIG. 4 is a schematic diagram illustrating another example configuration of word lines and pull-down transistors of a memory device in accordance with at least one embodiment of the present disclosure.

Accordingly, the configuration of word lines 302-310 and pull-down transistors 322-340 of FIG. 3 may decrease the effects of capacitive coupling between a word line and word lines adjacent thereto (e.g., the two closest neighboring word lines) when compared with a configuration of word lines without pull-down transistors (e.g., as illustrated in FIG. 2). As shown in FIG. 4, another example configuration of word lines and pull-down transistors may decrease the effects of capacitive coupling between a word line and its four closest neighboring word lines, i.e., not just the word line's immediate neighbors but also the word lines adjacent to the word line's immediate neighbors.

FIG. 4 is a schematic diagram illustrating another example configuration of word lines and pull-down transistors of a memory device 400 in accordance with at least one embodiment of the present disclosure. In particular, FIG. 4 illustrates a word line 402, a word line 404, a word line 406, a word line 408, a word line 410, a word line 412, a word line 414, a driver 416, a driver 418, a driver 420, a driver 422, a driver 424, a driver 426, and a driver 428. Word line 402 is electrically coupled to driver 416, word line 404 is electrically coupled to driver 418, word line 406 is electrically coupled to driver 420, word line 408 is electrically coupled to driver 422, word line 410 is electrically coupled to driver 424, word line 412 is electrically coupled to driver 426, and word line 414 is electrically coupled to driver 428. In the present disclosure, word line 402, word line 404, word line 406, word line 408, word line 410, word line 412, and word line 414 may be referred to collectively as word lines 402-414, and driver 416, driver 418, driver 420, driver 422, driver 424, driver 426, and driver 428 may be referred to collectively as drivers 416-428.

Additionally, FIG. 4 illustrates a pull-down transistor 430, a pull-down transistor 432, a pull-down transistor 434, a pull-down transistor 436, a pull-down transistor 438, a pull-down transistor 440, a pull-down transistor 442, a pull-down transistor 444, a pull-down transistor 446, a pull-down transistor 448, a pull-down transistor 450, a pull-down transistor 452, a pull-down transistor 454, a pull-down transistor 456, a pull-down transistor 458, a pull-down transistor 460, a pull-down transistor 462, a pull-down transistor 464, a pull-down transistor 466, a pull-down transistor 468, a pull-down transistor 470, a pull-down transistor 472, a pull-down transistor 474, a pull-down transistor 476, a pull-down transistor 478, a pull-down transistor 480, a pull-down transistor 482, and a pull-down transistor 484. In the present disclosure, the pull-down transistors shown in FIG. 4 may be referred to collectively as pull-down transistors 430-484. Similar to what was described above with regard to pull-down transistors 322-340 of FIG. 3, each of pull-down transistors 430-484 may be electrically coupled to two of word lines 402-414. For example, pull-down transistor 430 may have a gate electrically coupled to word line 402 and a drain electrically coupled to word line 404, and pull-down transistor 432 may have a gate electrically coupled to word line 402 and a drain electrically coupled to word line 406. Additionally, similar to what was described above with regard to pull-down transistors 322-340 of FIG. 3, each of pull-down transistors 430-484 may be configured to (when activated) pull a voltage of a word line to which its drain is electrically coupled to a particular voltage (e.g., a default voltage of a word line that is not being accessed, e.g., −0.25 volts).

In the configuration illustrated in FIG. 4, each of word lines 402-414 is electrically coupled to a gate of four of pull-down transistors. In particular, each of word lines 402-414 is electrically coupled to gates of pull-down transistors that are electrically coupled (through drains of the pull-down transistors) to its four closest neighboring word lines. For example, word line 410 is electrically coupled to: a gate of pull-down transistor 444 (which has a drain electrically coupled to word line 406), a gate of pull-down transistor 446 (which has a drain electrically coupled to word line 408), a gate of pull-down transistor 448 (which has a drain electrically coupled to word line 412), and a gate of pull-down transistor 450 (which has a drain electrically coupled to word line 414).

Thus, when any of word lines 402-414 is charged (e.g., to an access voltage to access memory cells associated therewith) the voltage on the charged word line is provided to the gates of the pull-down transistors that are electrically coupled to the four word lines closest to the charged word line. For example, if word line 410 is charged to an access voltage, the gates of pull-down transistor 444, pull-down transistor 446, pull-down transistor 448, and pull-down transistor 450 may also receive the access voltage.

And, when a memory device charges a particular word line (e.g., to access particular memory cells associated with the particular word line), the voltage charging the particular word line may also activate pull-down transistors that are electrically coupled to the four closest word lines to the particular word line. Pulling down a voltage may decrease the effect of capacitive coupling between word lines. For example, if word line 410 is charged (e.g., to access memory cells associated with word line 410), pull-down transistor 444, pull-down transistor 446, pull-down transistor 448, and pull-down transistor 450 may be activated, which may pull down the voltage of word line 406, word line 408, word line 412, and word line 414 and decrease the effect of capacitive coupling between word line 410 and word line 406, between word line 410 and word line 408, between word line 410 and word line 412, and/or between word line 410 and word line 414.

From another perspective, in the configuration illustrated in FIG. 4, each of word lines 402-414 is electrically coupled to a drain of four of pull-down transistors 430-484. In particular, each of word lines 402-414 is electrically coupled to drains of pull-down transistors that are electrically coupled (through gates) to its four closest neighboring word lines. For example, word line 410 is electrically coupled to: a drain of pull-down transistor 436 (which has a gate electrically coupled to word line 412) a drain of pull-down transistor 458 (which has a gate electrically coupled to word line 408), a drain of pull-down transistor 470 (which has a gate electrically coupled to word line 406), and a drain of pull-down transistor 482 (which has a gate electrically coupled to word line 414). Thus, any of word lines 402-414 may have its voltage pulled down when a word line that is one of its four closest neighbors is charged. For example, word line 410 may have its voltage pulled down when any of word line 406, word line 408, word line 412, or word line 414 is charged.

Although FIG. 3 and FIG. 4 illustrate five and seven word lines respectively, any number of word lines are conceptualized and are within the scope of this disclosure. Additionally, although the word lines illustrated and described with regard to FIG. 3 and FIG. 4 each have two adjacent word lines, word lines that have only one adjacent word line (e.g., by being a first or last word line in a group of word lines) are also conceptualized and are within the scope of this disclosure. Further, although FIG. 3 illustrates a configuration in which each word line is electrically coupled to its closest two neighboring word lines, and FIG. 4 illustrates a configuration in which each word line is electrically coupled to its closest four neighboring word lines, extensions of these concepts are conceptualized and are within the scope of this disclosure. As a specific, non-limiting example, configurations in which each word line is coupled to its closest six, eight, or ten closest neighboring word lines are conceptualized and are within the scope of this disclosure.

Figure 5:
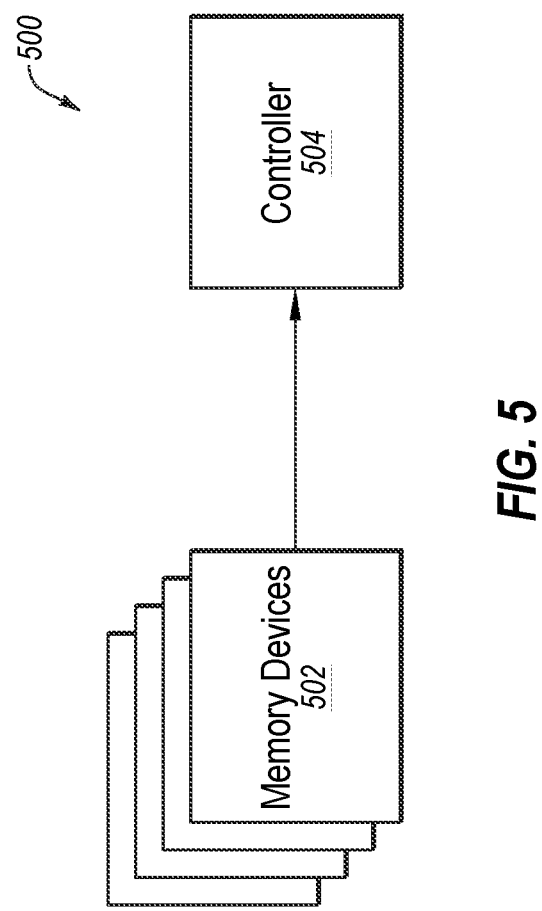
FIG. 5 is a simplified block diagram illustrating an example memory system, in accordance with at least one embodiment of the present disclosure.

FIG. 5 is a simplified block diagram illustrating an example memory system 500 implemented in accordance with at least one embodiment of the present disclosure. Memory system 500, which may include, for example, a semiconductor device, includes a number of memory devices 502 and a controller 504. Controller 504 may be operatively coupled with memory devices 502 so as to convey command/address signals (e.g., command/address signals received by command terminals 112 and/or address terminals 110 of FIG. 1) to memory devices 502.

At least one of memory devices 502 may be a memory device in accordance with at least one embodiment of the present disclosure. For example, at least one of memory devices 502 may include word lines and pull-down transistors arranged according to the configuration of memory device 300 of FIG. 3 and/or memory device 400 of FIG. 4.

An electronic system is also disclosed. According to various embodiments, the electronic system may include a memory device including a number of memory dies, each memory die having an array of memory cells. Each memory cell may include an access transistor and a storage element operably coupled with the access transistor.

Figure 6:
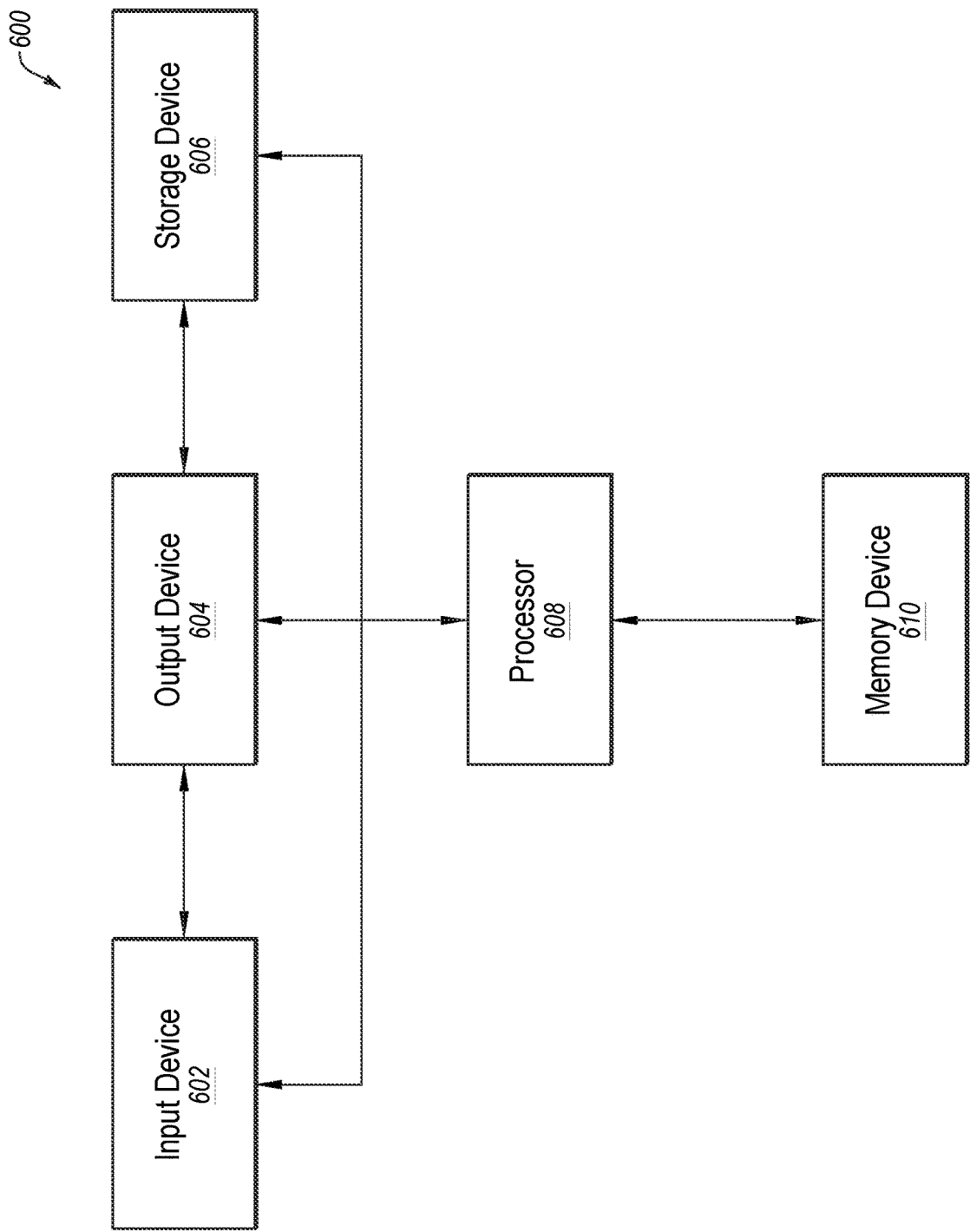
FIG. 6 is a simplified block diagram illustrating an example electronic system, in accordance with at least one embodiment of the present disclosure.

FIG. 6 is a simplified block diagram illustrating an electronic system 600 implemented in accordance with at least one embodiment of the present disclosure. Electronic system 600 includes at least one input device 602, which may include, for example, a keyboard, a mouse, or a touch screen. Electronic system 600 further includes at least one output device 604, such as a monitor, a touch screen, or a speaker. Input device 602 and output device 604 are not necessarily separable from one another. Electronic system 600 further includes a storage device 606. Input device 602, output device 604, and storage device 606 may be coupled to a processor 608. Electronic system 600 further includes a memory device 610 coupled to processor 608. Memory device 610 may include at least a portion of memory system 500 of FIG. 5. Electronic system 600 may include, for example, a computing, processing, industrial, or consumer product. For example, without limitation, electronic system 600 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

One or more embodiments of the present disclosure may include a memory device. The memory device may include a number of memory cells, a first word line, and a second word line. The first word line may be configured to apply a voltage to a number of transistors to access at least one of the number of memory cells. The first word line may include a first portion electrically coupled to a first driver and a second portion electrically coupled to a gate of a pull-down transistor. The second word line may be positioned adjacent to the first word line. The second word line may include a third portion electrically coupled to a second driver and a fourth portion electrically coupled to a drain of the pull-down transistor.

Another embodiment of the present disclosure may include a memory device. The memory device may include a first word line. The first word line may be configured to apply a voltage to a number of transistors to access a number of memory cells of the memory device. The first word line may include a first portion electrically coupled to a driver and a second portion. The second portion may be electrically coupled to: a gate of a first pull-down transistor, a drain of a second pull-down transistor, and a drain of a third pull-down transistor.

Yet another embodiment of the present disclosure may include a system. The system may include: at least one input device, at least one output device, at least one processor device, and at least one memory device. The at least one processor device may be operably coupled to the input device and the output device. The memory device may be operably coupled to the at least one processor device. The memory device may include: a first word line, a second word line, and a first pull-down transistor. The first word line may be configured to apply a voltage to a number of transistors to access a number of memory cells of the memory device. The second word line may be adjacent the first word line. The first pull-down transistor may include a drain and a gate. The drain may be electrically coupled to the first word line. The gate may be electrically coupled to the second word line.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A memory device comprising:
   a number of memory cells;
   a first word line configured to apply a voltage to a first number of transistors to access at least one memory cell of a first subset of the number of memory cells, the first word line comprising:
      a respective first portion electrically coupled to a first driver at a first side of the memory device; and
      a respective second portion electrically coupled to:
         a gate of a first pull-down transistor at a second side of the memory device, the second side opposite the first side, the first pull-down transistor closer to the second side than the first pull-down transistor is to the first side;
         a gate of a second pull-down transistor at the second side of the memory device, the second pull-down transistor closer to the second side than the second pull-down transistor is to the first side;
         a terminal of a third pull-down transistor at the second side of the memory device, the third pull-down transistor closer to the second side than the second pull-down transistor is to the first side; and
         a terminal of a fourth pull-down transistor at the second side of the memory device, the fourth pull-down transistor closer to the second side than the second pull-down transistor is to the first side;
   a second word line positioned adjacent to the first word line, the second word line configured to apply a voltage to a second number of transistors to access at least one memory cell of a second subset of the number of memory cells, the second word line comprising:
      a respective first portion electrically coupled to a second driver at the first side of the memory device; and
      a respective second portion electrically coupled to:
         a terminal of the first pull-down transistor; and
         a gate of the third pull-down transistor; and
   a third word line positioned adjacent to the first word line, the third word line configured to apply a voltage to a third number of transistors to access at least one memory cell of a third subset of the number of memory cells, the third word line comprising:
      a respective first portion electrically coupled to a third driver at the first side of the memory device; and
      a respective second portion electrically coupled to:
         a terminal of the second pull-down transistor; and
         a gate of the fourth pull-down transistor.

2. The memory device of claim 1, further comprising a fourth word line positioned adjacent to the second word line, the fourth word line comprising a respective first portion electrically coupled to a fourth driver at the first side of the memory device and a respective second portion electrically coupled to a terminal of a fifth pull-down transistor, a gate of the fifth pull-down transistor electrically coupled to the respective second portion of the first word line.

3. The memory device of claim 2, wherein the respective second portion of the fourth word line is additionally electrically coupled to a gate of a sixth pull-down transistor, a terminal of the sixth pull-down transistor electrically coupled to the respective second portion of the first word line.

4. The memory device of claim 1, wherein the first word line extends substantially parallel to the second word line from the first side of the memory device to the second side of the memory device.

5. The memory device of claim 1, wherein the respective second portion of the first word line is configured to apply the voltage to the gate of the first pull-down transistor sufficient to cause the first pull-down transistor to allow current to flow from the terminal of the first pull-down transistor thereby decreasing capacitive coupling between the first word line and the second word line and the respective second portion of the first word line is configured to apply the voltage to the gate of the second pull-down transistor sufficient to cause the second pull-down transistor to allow current to flow from the terminal of the second pull-down transistor thereby decreasing capacitive coupling between the first word line and the third word line.

6. The memory device of claim 1, wherein the first word line is configured such that when the first word line applies voltage to the first number of transistors the first word line applies the voltage to the gate of the first pull-down transistor and the gate of the second pull-down transistor.

7. The memory device of claim 1, wherein the number of memory cells comprise dynamic random-access memory (DRAM) memory cells.

8. A memory device comprising:
   a first word line configured to apply a voltage to a first number of transistors to access a first subset of a number of memory cells, the first word line extending from a first side of a memory device to a second side of the memory device, the first word line comprising:
      a respective first portion electrically coupled to a driver at the first side of the memory device; and
      a respective second portion electrically coupled, at the second side of the memory device, to:
         a gate of a first pull-down transistor;
         a gate of a second pull-down transistor
         a terminal of a third pull-down transistor; and
         a terminal of a fourth pull-down transistor;
   a second word line, positioned adjacent to the first word line, the second word line configured to apply a voltage to a second number of transistors to access a second subset of the number of memory cells, the second word line comprising:
   a respective first portion electrically coupled to a second driver at the first side of the memory device; and
   a respective second portion electrically coupled, at the second side of the memory device, to:
     a terminal of the first pull-down transistor; and
     a gate of the third pull-down transistor; and
a third word line, positioned adjacent to the first word line, the third word line configured to apply a voltage to a third number of transistors to access a third subset of the number of memory cells, the third word line comprising:
   a respective first portion electrically coupled to a third driver at the first side of the memory device; and
   a respective second portion electrically coupled, at the second side of the memory device, to:
     a terminal of the second pull-down transistor; and
     a gate of the fourth pull-down transistor.

9. The memory device of claim 8, further comprising:
a fourth word line positioned adjacent to the second word line, the fourth word line comprising:
   a respective first portion electrically coupled to a fourth driver at the first side of the memory device; and
   a respective second portion electrically coupled, at the second side of the memory device, to:
     a terminal of a fifth pull-down transistor, a gate of the fifth pull-down transistor electrically coupled to the respective second portion of the first word line; and
     a gate of a sixth pull-down transistor, a terminal of the sixth pull-down transistor electrically coupled to the respective second portion of the first word line.

10. A system, comprising:
at least one input device;
at least one output device;
at least one processor device operably coupled to the input device and the output device; and
at least one memory device operably coupled to the at least one processor device and comprising:
   a first word line configured to apply a voltage to a first number of transistors to access a first subset of a number of memory cells of the memory device, a respective first portion of the first word line electrically coupled to a first driver and a respective second portion of the first word line extending from a first side of the memory device to a second side of the memory device, the second side opposite the first side;
   a second word line adjacent the first word line, the second word line configured to apply a voltage to a second number of transistors to access a second subset of the number of memory cells of the memory device, a respective first portion of the second word line electrically coupled to a second driver proximate to the first driver, a respective second portion of the second word line extending from the first side to the second side;
   a third word line adjacent the first word line, the third word line configured to apply a voltage to a third number of transistors to access a third subset of the number of memory cells of the memory device, a respective first portion of the third word line electrically coupled to a third driver proximate to the first driver, a respective second portion of the third word line extending from the first side to the second side;
   a first pull-down transistor, closer to the second side of the memory device than to the first side of the memory device, the first pull-down transistor comprising:
     a gate electrically coupled to the respective second portion of the first word line; and
     a terminal electrically coupled to the respective second portion of the second word line;
   a second pull-down transistor, closer to the second side of the memory device than to the first side of the memory device, the second pull-down transistor comprising:
     a gate electrically coupled to the respective second portion of the first word line; and
     a terminal electrically coupled to the respective second portion of the third word line;
   a third pull-down transistor, closer to the second side of the memory device than to the first side of the memory device, the third pull-down transistor comprising:
     a terminal electrically coupled to the respective second portion of the first word line; and
     a gate electrically coupled to the respective second portion of the second word line; and
   a fourth pull-down transistor, closer to the second side of the memory device than to the first side of the memory device, the fourth pull-down transistor comprising:
     a terminal electrically coupled to the respective second portion of the first word line; and
     a gate electrically coupled to the respective second portion of the third word line.

11. The system of claim 10, wherein the memory device further comprises:
a fourth word line adjacent the second word line, a respective first portion of the fourth word line electrically coupled to a fourth driver proximate to the second driver, a respective second portion of the fourth word line extending from the first side to the second side; and
a fifth pull-down transistor comprising:
   a gate electrically coupled to the respective second portion of the first word line; and
   a terminal electrically coupled to the respective second portion of the fourth word line; and
a sixth pull-down transistor comprising:
   a terminal electrically coupled to the respective second portion of the first word line; and
   a gate electrically coupled to the respective second portion of the fourth word line.

12. The system of claim 10, wherein the first word line extends substantially parallel to the second word line.

\* \* \* \* \*